(12) United States Patent
Kim

(10) Patent No.: US 10,389,365 B2
(45) Date of Patent: Aug. 20, 2019

(54) LOW POWER CRYSTAL OSCILLATION CIRCUITS

(71) Applicant: SK hynix Inc., Icheon-si Gyeonggi-do (KR)

(72) Inventor: Gyu Nam Kim, Icheon-si (KR)

(73) Assignee: SK hynix Inc., Icheon-si, Gyeonggi-do (KR)

(*) Notice: Subject to any disclaimer, the term of this patent is extended or adjusted under 35 U.S.C. 154(b) by 140 days.

(21) Appl. No.: 15/612,420

(22) Filed: Jun. 2, 2017

(65) Prior Publication Data

US 2018/0109264 A1  Apr. 19, 2018

(30) Foreign Application Priority Data

Oct. 13, 2016  (KR) .......................... 10-2016-0132938

(51) Int. Cl.
| | |
|---|---|
| *H03B 5/36* | (2006.01) |
| *H03L 5/02* | (2006.01) |
| *H03L 5/00* | (2006.01) |
| H03K 3/037 | (2006.01) |

(52) U.S. Cl.
CPC .............. *H03L 5/00* (2013.01); *H03B 5/364* (2013.01); *H03L 5/02* (2013.01); *H03B 2200/0082* (2013.01); *H03K 3/0377* (2013.01)

(58) Field of Classification Search
CPC . H03B 5/30; H03B 5/32; H03B 5/364; H03B 5/1278; H03B 2200/0082; H03B 2201/031; H03K 3/0377; H03L 5/00; H03L 5/02

USPC .................. 331/15, 154, 158, 160, 182, 183
See application file for complete search history.

(56) References Cited

U.S. PATENT DOCUMENTS

| | | | | |
|---|---|---|---|---|
| 4,039,973 | A | 8/1977 | Yamashiro | |
| 5,481,228 | A * | 1/1996 | Badyal | H03B 5/366 327/175 |
| 6,278,338 | B1 * | 8/2001 | Jansson | H03B 5/364 331/109 |
| 7,902,933 | B1 * | 3/2011 | Brennan | H03L 5/00 331/116 R |
| 8,228,130 | B1 * | 7/2012 | Ivanov | H03B 5/364 331/107 A |
| 8,803,622 | B1 * | 8/2014 | Yan | H03B 5/36 331/116 M |
| 9,054,637 | B1 * | 6/2015 | Mittal | H03B 5/364 |
| 9,407,201 | B1 * | 8/2016 | Iguchi | H03B 5/364 |

(Continued)

*Primary Examiner* — Levi Gannon
(74) *Attorney, Agent, or Firm* — William Park & Associates Ltd.

(57) ABSTRACT

A crystal oscillation circuit includes a crystal oscillator coupled between an input pad node and an output pad node, a current mirror inverting amplifier configured to have a first input terminal coupled to the input pad node and an output terminal coupled to the output pad node, a detection logic circuit configured to detect a signal of the output pad node to generate an output pad node detection signal, and an automatic control logic circuit configured to apply a pull-up driver control signal to a second input terminal of the current mirror inverting amplifier in response to the output pad node detection signal. The current mirror inverting amplifier operates with a first gain or a second gain lower than the first gain according to the pull-up driver control signal.

19 Claims, 5 Drawing Sheets

(56) References Cited

U.S. PATENT DOCUMENTS

| | | | | |
|---|---|---|---|---|
| 2007/0024385 A1* | 2/2007 | Greenberg | ............. | H03B 5/364 |
| | | | | 331/158 |
| 2007/0030085 A1* | 2/2007 | Brennan | .................. | H03B 5/06 |
| | | | | 331/177 V |
| 2012/0242419 A1* | 9/2012 | Tsai | .......................... | H03L 5/00 |
| | | | | 331/109 |
| 2012/0326762 A1* | 12/2012 | Sakai | ....................... | H03B 5/06 |
| | | | | 327/291 |
| 2015/0028956 A1* | 1/2015 | Okamoto | .................. | H03L 7/16 |
| | | | | 331/18 |
| 2016/0218671 A1* | 7/2016 | Jun | ........................ | H03B 5/362 |

\* cited by examiner

LOW POWER CRYSTAL OSCILLATION CIRCUITS

CROSS-REFERENCE TO RELATED APPLICATIONS

The present application claims priority under 35 U.S.C 119(a) to Korean Application No. 10-2016-0132938, filed on Oct. 13, 2016, which is herein incorporated by reference in its entirety.

BACKGROUND

1. Technical Field

Various embodiments of the present disclosure relate to oscillation circuits and, more particularly, to low power crystal oscillation circuits.

2. Related Art

Most circuits operate using a reference clock signal. The reference clock signal, for example a periodic signal having a uniform pulse width, may be generated by an oscillation circuit. The oscillation circuit may generate a clock signal while a power supply voltage is applied to the oscillation circuit and may terminate generation of the clock signal if the power supply voltage is interrupted. The oscillation circuit may be employed in semiconductor devices to generate various internal signals. For example, the oscillation circuit may be used as a clock generation circuit for generating an internal clock signal of the semiconductor device, or may be used in a voltage generation circuit that receives an external voltage to generate a plurality of internal voltages of the semiconductor device.

As mobile systems are more common, power consumption of mobile systems has been regarded as an important parameter. Accordingly, various integrated circuits employed in mobile systems have been designed to reduce power consumption. In particular, a lot of effort has focused on reducing the power consumption of the oscillation circuit.

SUMMARY

Various embodiments are directed to low power crystal oscillation circuits.

According to an embodiment, a crystal oscillation circuit includes a crystal oscillator coupled between an input pad node and an output pad node, a current mirror inverting amplifier configured to have a first input terminal coupled to the input pad node and an output terminal coupled to the output pad node, a detection logic circuit configured to detect a signal of the output pad node to generate an output pad node detection signal, and an automatic control logic circuit configured to apply a pull-up driver control signal to a second input terminal of the current mirror inverting amplifier in response to the output pad node detection signal. The current mirror inverting amplifier operates with a first gain or a second gain lower than the first gain according to the pull-up driver control signal.

BRIEF DESCRIPTION OF THE DRAWINGS

Various embodiments of the present disclosure will become more apparent in view of the attached drawings and accompanying detailed description, in which.

DETAILED DESCRIPTION OF THE EMBODIMENTS

In the following description of the embodiments, it will be understood that the terms "first" and "second" are intended to identify an element, but not used to define only the element itself or to mean a particular sequence. In addition, when an element is referred to as being located "on", "over", "above", "under" or "beneath" another element, it is intended to mean relative position relationship, but not used to limit certain cases that the element directly contacts the other element, or at least one intervening element is present therebetween. Accordingly, the terms such as "on", "over", "above", "under", "beneath", "below" and the like that are used herein are for the purpose of describing particular embodiments only and are not intended to limit the scope of the present disclosure. Further, when an element is referred to as being "connected" or "coupled" to another element, the element may be electrically or mechanically connected or coupled to the other element directly, or may form a connection relationship or coupling relationship by replacing the other element therebetween.

Figure 1:
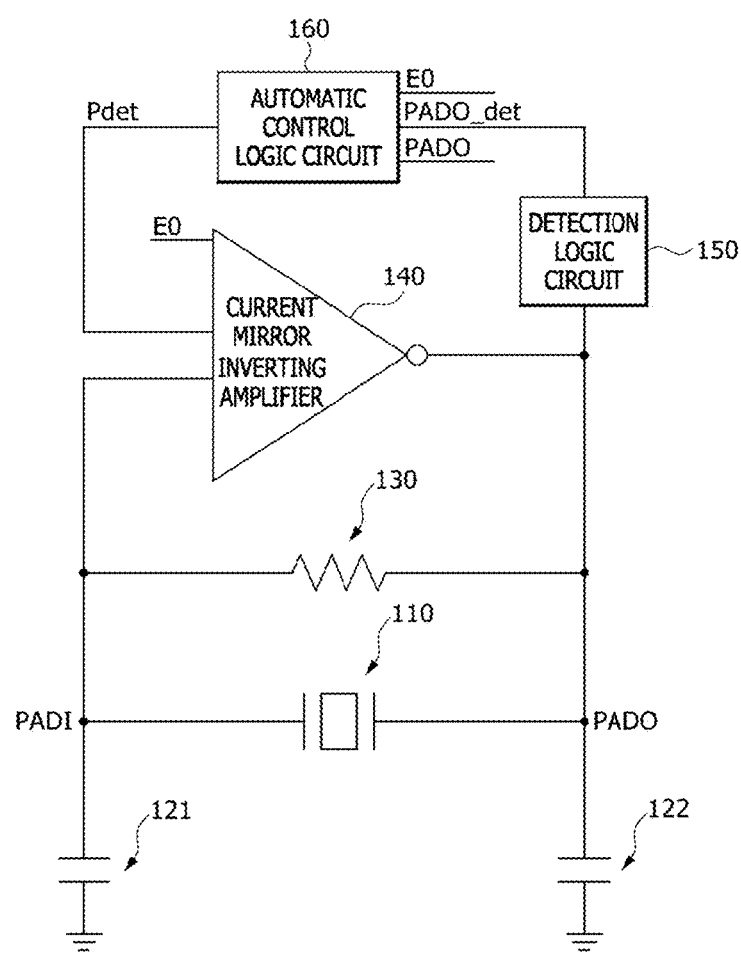
FIG. 1 is a schematic view illustrating a configuration of a crystal oscillation circuit according to an embodiment of the present disclosure.

FIG. 1 is a schematic view illustrating a configuration of a crystal oscillation circuit 100 according to an embodiment of the present disclosure. Referring to FIG. 1, the crystal oscillation circuit 100 may include a crystal oscillator 110 coupled between an input pad node PADI and an output pad node PADO. In some embodiments, the crystal oscillator 110 may be disposed in an outside region of a chip including some components of the crystal oscillation circuit 100 and may generate a periodic signal together with the components included in the chip where the periodic signal may have a sine wave. The input pad node PADI and the output pad node PADO may be connected to a ground terminal through a couple of load capacitors 121 and 122, respectively. A feedback resistor 130 may also be coupled between the input pad node PADI and the output pad node PADO. Accordingly, the crystal oscillator 110 and the feedback resistor 130 may be coupled in parallel between the input pad node PADI and the output pad node PADO. The feedback resistor 130 may have a resistance value of about several tens of kilo-ohms to increase a gain of a current mirror inverting amplifier 140 included in the crystal oscillation circuit 100. The chip of the crystal oscillation circuit 100 may be configured to include the current mirror inverting amplifier 140, a detection logic circuit 150, and an automatic control logic circuit 160. An output terminal of the current mirror inverting amplifier 140 may be coupled to the output pad node PADO and an input terminal of the detection logic circuit 150. Input terminals of the current mirror inverting amplifier 140 may be coupled to the input pad node PADI and an output terminal of the automatic control logic circuit 160, respectively. The current mirror inverting amplifier 140 may additionally receive an enablement signal E0. Input terminals of the automatic control logic circuit 160 may be coupled to an output terminal of the detection logic circuit 150 and the output pad node PADO, respectively. The automatic control logic circuit 160 may additionally receive the enablement signal E0. Thus, the automatic control logic circuit 160 may output a pull-up driver control signal Pdet through the output terminal of the automatic control logic circuit 160, in response to an output pad node detection signal PADO_det outputted from the detection logic circuit 150, a signal of the output pad node PADO, and the enablement signal E0. The pull-up driver control signal Pdet may be inputted to any one of the input terminals of the current mirror inverting amplifier 140.

The current mirror inverting amplifier 140 may selectively perform one of a first inverting amplification operation and a second inverting amplification operation to generate an oscillation signal, in response to a signal of the input pad node PADI, the enablement signal E0, and the pull-up driver control signal Pdet. The current mirror inverting amplifier 140 may exhibit a first gain while the first inverting amplification operation is performed and may exhibit a second gain while the second inverting amplification operation is performed. In some embodiments, the second gain may be lower than the first gain. Thus, the power consumption of the current mirror inverting amplifier 140 during the second inverting amplification operation may be less than the power consumption of the current mirror inverting amplifier 140 during the first inverting amplification operation. In some embodiments, the first inverting amplification operation may be performed in response to the pull-up driver control signal Pdet having a first level, for example, a low level, and the second inverting amplification operation may be performed in response to the pull-up driver control signal Pdet having a second level, for example, a high level.

The detection logic circuit 150 may detect a signal of the output pad node PADO to generate the output pad node detection signal PADO_det. The detection logic circuit 150 may reduce an amplitude of a signal of the output pad node PADO to generate the output pad node detection signal PADO_det. The detection logic circuit 150 may function as an open circuit if a direct current (DC) signal is inputted to the detection logic circuit 150.

The automatic control logic circuit 160 may generate the pull-up driver control signal Pdet in response to the output pad node detection signal PADO_det, a signal of the output pad node PADO, and the enablement signal E0. In some embodiments, the pull-up driver control signal Pdet may maintain a low level during a first time period before a normal oscillation signal having a steady state is generated, and a level transition of the pull-up driver control signal Pdet may occur when the normal oscillation signal having a steady state is generated. Thus, the pull-up driver control signal Pdet may have a high level from the time that the normal oscillation signal having a steady state is generated. The pull-up driver control signal Pdet may have a high level while the normal oscillation signal is generated and may have a low level if an abnormal oscillation signal is generated.

Figure 2:
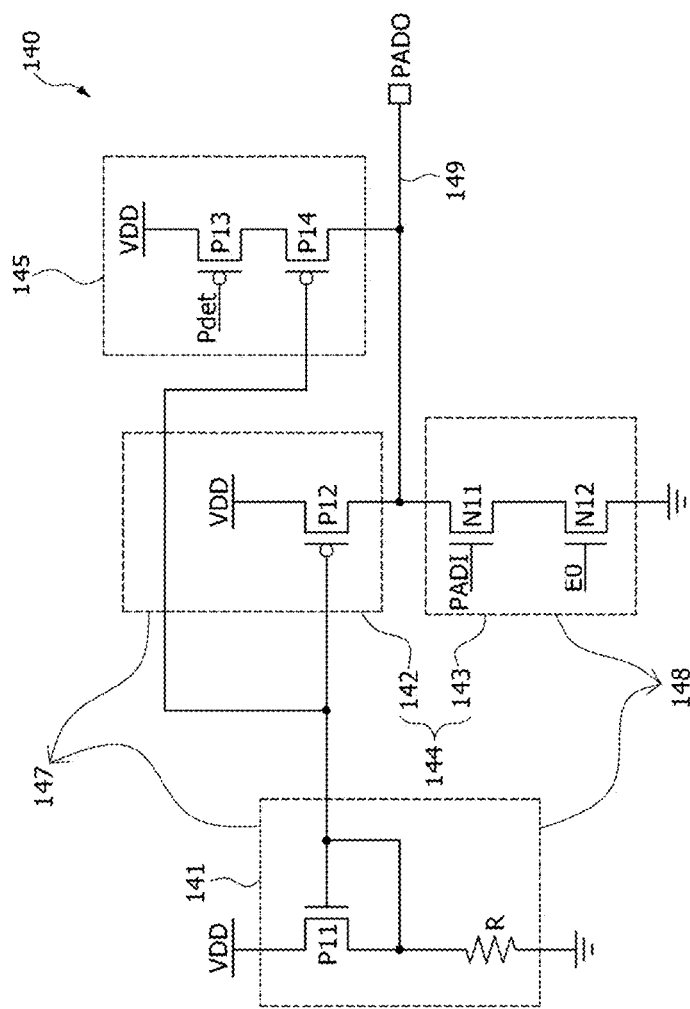
FIG. 2 is a circuit diagram illustrating an example of a current mirror inverting amplifier included in the crystal oscillation circuit of FIG. 1.

FIG. 2 is a circuit diagram illustrating an example of the current mirror inverting amplifier 140 included in the crystal oscillation circuit 100 of FIG. 1. Referring to FIG. 2, the current mirror inverting amplifier 140 may be configured to include a current source 141, an inverter 144 comprised of a first pull-up driver 142 and a pull-down driver 143, and a second pull-up driver 145. The current source 141 and the first pull-up driver 142 may constitute a first current mirror circuit 147, and the current source 141 and the second pull-up driver 145 may constitute a second current mirror circuit 148.

The current source 141 may be configured to include a first PMOS transistor P11 and a resistor R which are coupled in series between the power supply voltage VDD terminal and a ground terminal. A source and a drain of the first PMOS transistor P11 may be coupled to the power supply voltage VDD terminal and one terminal of the resistor R, respectively. The other terminal of the resistor R may be coupled to the ground terminal. A drain and a gate of the first PMOS transistor P11 may be coupled to each other so that the first PMOS transistor P11 has a diode-connected structure. The current source 141 may generate a current having an amount which is determined by a characteristic of the first PMOS transistor P11 and a resistance value of the resistor R.

The first pull-up driver 142 of the inverter 144 may be realized using a second PMOS transistor P12 having a source and a drain which are respectively coupled between the power supply voltage VDD terminal and an output line 149. The output line 149 may be coupled to the output pad node PADO. A gate of the second PMOS transistor P12 may be directly coupled to the gate of the first PMOS transistor P11 so that the first and second PMOS transistors P11 and P12 constitute the first current mirror circuit 147. Thus, a first mirroring current of a current generated by the current source 141 may flow through a channel between a drain and a source of the second PMOS transistor P12.

The pull-down driver 143 of the inverter 144 may be configured to include a first NMOS transistor N11 and a second NMOS transistor N12 which are coupled in series between the output line 149 and a ground terminal. A drain and a source of the first NMOS transistor N11 may be coupled to the output line 149 and a drain of the second NMOS transistor N12, respectively. A source of the second NMOS transistor N12 may be coupled to the ground terminal. A gate of the first NMOS transistor N11 may be coupled to the input pad node PADI. The enablement signal E0 may be applied to a gate of the second NMOS transistor N12. If the enablement signal E0 is a low level signal, the second NMOS transistor N12 may be turned off. If the second NMOS transistor N12 is turned off, the crystal oscillation circuit 100 may not perform an oscillation operation.

In some embodiments, transconductance values of the first and second NMOS transistor N11 and N12 may be greater than a transconductance value of the second PMOS transistor P12. Thus, if at least one of the first and second NMOS transistors N11 and N12 is turned off, a high level signal may be outputted through the output line 149. In contrast, if both of the first and second NMOS transistors N11 and N12 are turned on, a low level signal may be outputted through the output line 149. Because the enablement signal E0 is a high level signal while the crystal oscillation circuit 100 operates, the second NMOS transistor N12 may be turned on while the crystal oscillation circuit 100 operates. Thus, activation of the pull-down driver 143 may depend on a signal of the input pad node PADI, where the signal of the input pad node PADI may be applied to the gate of the first NMOS transistor N11. That is, the pull-down driver 143 may be activated if a signal of the input pad node PADI is a high level signal, and the first pull-up driver 142 may be activated if a signal of the input pad node PADI is a low level signal.

The first and second pull-up drivers 142 and 145 may be coupled in parallel between the power supply voltage VDD terminal and the output line 149. Specifically, the second pull-up driver 145 may be configured to include a third PMOS transistor P13 and a fourth PMOS transistor P14 which are coupled in series between the power supply voltage VDD terminal and the output line 149. A source and a drain of the third PMOS transistor P13 may be coupled to the power supply voltage VDD terminal and a source of the fourth PMOS transistor P14, respectively. A drain of the fourth PMOS transistor P14 may be coupled to the output line 149. The pull-up driver control signal Pdet outputted from the automatic control logic circuit 160 may be applied to a gate of the third PMOS transistor P13. A gate of the fourth PMOS transistor P14 may be directly coupled to a gate of the first PMOS transistor P11.

Because the first and fourth PMOS transistors P11 and P14 may be coupled to each other to constitute the second current mirror circuit 148, an operation of the second pull-up driver 145 may be controlled by the pull-up driver control signal Pdet. If the pull-up driver control signal Pdet is a low level signal, the fourth PMOS transistor P14 may be turned on to activate the second pull-up driver 145. In contrast, if the pull-up driver control signal Pdet is a high level signal, the fourth PMOS transistor P14 may be turned off to inactivate the second pull-up driver 145. If the second pull-up driver 145 is activated, the first and second pull-up drivers 142 and 145 may perform a total pull-up driving operation of the current mirror inverting amplifier 140.

The current mirror inverting amplifier 140 may perform the first inverting amplification operation exhibiting the first gain if the pull-up driver control signal Pdet is a low level signal. In such a case, a pull-up driving operation of the inverter 144 may be performed by the first and second pull-up drivers 142 and 145. In contrast, if the pull-up driver control signal Pdet is a high level signal, the current mirror inverting amplifier 140 may perform the second inverting amplification operation exhibiting the second gain. In such a case, only the first pull-up driver 142 performs a pull-up driving operation of the inverter 144. Accordingly, the second gain may be lower than the first gain. Thus, if the current mirror inverting amplifier 140 performs the second inverting amplification operation, a power consumption of the current mirror inverting amplifier 140 may be reduced.

Figure 3:
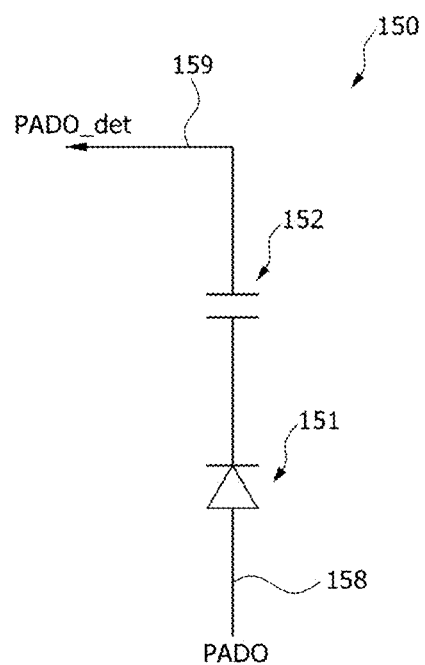
FIG. 3 is a circuit diagram illustrating an example of a detection logic circuit included in the crystal oscillation circuit of FIG. 1.

FIG. 3 is a circuit diagram illustrating an example of the detection logic circuit 150 included in the crystal oscillation circuit 100 of FIG. 1. Referring to FIG. 3, the detection logic circuit 150 may be configured to include a PN diode 151 and a capacitor 152 which are coupled in series between the output pad node PADO and an output line 159. An anode of the PN diode 151 may be coupled to an input line 158 connected to the output pad node PADO. A cathode of the PN diode 151 may be coupled to one terminal of the capacitor 152. The other terminal of the capacitor 152 may be coupled to the output line 159 through which the output pad node detection signal PADO_det is outputted. An oscillation signal inputted to the output pad node PADO may have a relatively high amplitude corresponding to a high voltage level. The oscillation signal may be transmitted to the capacitor 152 through the PN diode 151, and an amplitude of the oscillation signal at the cathode of the PN diode 151 may be less than an amplitude of the oscillation signal on the input line 158 due to a voltage drop across the PN diode 151. In some embodiments, a plurality of PN diodes may be coupled in series between the capacitor 152 and the input line 158 in order to further reduce an amplitude of the oscillation signal at the cathode of the PN diode 151. The oscillation signal at the cathode of the PN diode 151 may pass the capacitor 152 and may be outputted as the output pad node detection signal PADO_det through the output line 159. If the oscillation signal of the output pad node PADO is an abnormal signal, for example, a DC signal, the capacitor 152 may act as an open circuit.

Figure 4:
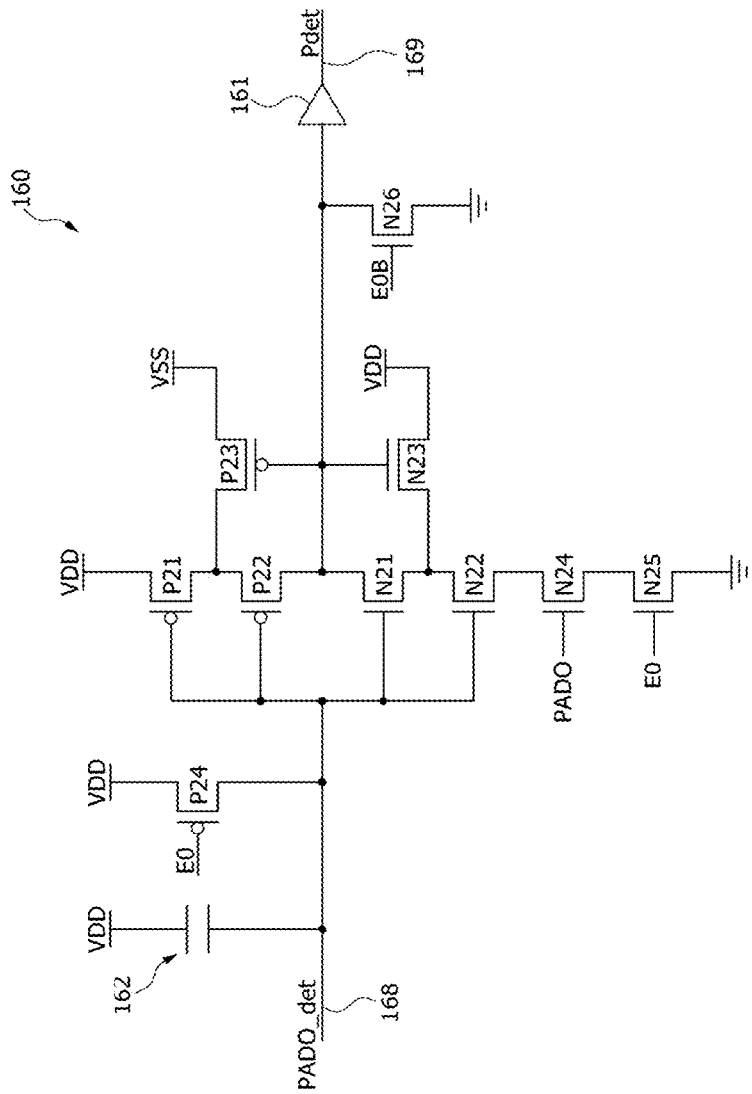
FIG. 4 is a circuit diagram illustrating an example of an automatic control logic circuit included in the crystal oscillation circuit of FIG. 1.

FIG. 4 is a circuit diagram illustrating an example of the automatic control logic circuit 160 included in the crystal oscillation circuit 100 of FIG. 1. Referring to FIG. 4, the automatic control logic circuit 160 may be realized using an inverter-type Schmitt trigger circuit that receives the output pad node detection signal PADO_det transmitted through an input line 168 to generate and output the pull-up driver control signal Pdet through an output line 169. The inverter-type Schmitt trigger circuit may include a first PMOS transistor P21 and a second PMOS transistor P22 which are coupled in series, a first NMOS transistor N21 and a second NMOS transistor N22 which are coupled in series, a third PMOS transistor P23, and a third NMOS transistor N23. The output pad node detection signal PADO_det may be inputted to gates of the first and second PMOS transistors P21 and P22 as well as gates of the first and second NMOS transistors N21 and N22. The third PMOS transistor P23 and the third NMOS transistor N23 may constitute a feedback structure that controls switching operations of the MOS transistors constituting the Schmitt trigger circuit.

Specifically, the first and second PMOS transistors PM21 and PM22 may be coupled in series between the power supply voltage VDD terminal and the output line 169. A source and a drain of the first PMOS transistor P21 may be coupled to the power supply voltage VDD terminal and a source of the second PMOS transistor P22, respectively. A drain of the second PMOS transistor P22 may be coupled to the output line 169. A node between a drain of the first PMOS transistor P21 and a source of the second PMOS transistor P22 may be coupled to a source of the third PMOS transistor P23. A gate and a drain of the third PMOS transistor P23 may be coupled to the output line 169 and the ground terminal (i.e., a ground voltage VSS terminal), respectively.

The first and second NMOS transistors N21 and N22 may be coupled in series between the output line 169 and the ground voltage VSS terminal. A drain and a source of the first NMOS transistor N21 may be coupled to the output line 169 and a drain of the second NMOS transistor N22, respectively. A source of the second NMOS transistor N22 may be coupled to the ground voltage VSS terminal through a fourth NMOS transistor N24 and a fifth NMOS transistor N25. A node between a source of the first NMOS transistor N21 and a drain of the second NMOS transistor N22 may be coupled to a source of the third NMOS transistor N23. A gate and a drain of the third NMOS transistor N23 may be coupled to the output line 169 and the power supply voltage VDD terminal, respectively.

The fourth NMOS transistor N24 and the fifth NMOS transistor N25 may be coupled in series between a source of the second NMOS transistor N22 and the ground terminal. A drain and a source of the fourth NMOS transistor N24 may be coupled to a source of the second NMOS transistor N22 and a drain of the fifth NMOS transistor N25, respectively. A source of the fifth NMOS transistor N25 may be coupled to the ground terminal. A gate of the fourth NMOS transistor N24 may be coupled to the output pad node PADO. The enablement signal E0 may be inputted to a gate of the fifth NMOS transistor N25.

A sixth NMOS transistor N26 may be coupled between the output line 169 and the ground terminal. An inverted signal E0B of the enablement signal E0 may be inputted to a gate of the sixth NMOS transistor N26. A buffer 161 may be disposed in the output line 169. A gate of the third PMOS transistor P23, a gate of the third NMOS transistor N23, and a drain of the sixth NMOS transistor N26 may be coupled to an input terminal of the buffer 161. A capacitor 162 and a fourth PMOS transistor P24 may be coupled in parallel between the power supply voltage VDD terminal and the input line 168. The enablement signal E0 may be inputted to a gate of the fourth PMOS transistor P24.

A fundamental operation of the automatic control logic circuit 160 will be described hereinafter. If the output pad node detection signal PADO_det is a low level signal, the third PMOS transistor P23 and the third NMOS transistor N23 may be respectively turned off and turned on and a high level signal may be outputted as the pull-up driver control signal Pdet through the output line 169. As a voltage level of the output pad node detection signal PADO_det increases, the second NMOS transistor N22 may be turned on and a voltage of a node between the first and second NMOS transistors N21 and N22 may be lowered. A high level input voltage VIH may be defined as a minimum voltage of the output pad node detection signal PADO_det that is required to turn on the first and second NMOS transistors N21 and N22. If the first NMOS transistor N21 is turned on, a drain voltage of the first NMOS transistor N21 may be lowered and the third NMOS transistor N23 may be turned off. In such a case, the third PMOS transistor P23 may be turned on and a low level signal may be outputted as the pull-up driver control signal Pdet through the output line 169. The high level input voltage VIH may be controlled by adjusting drain-to-source current drivabilities of the second and third NMOS transistors N22 and N23. In one particular example, the drain-to-source current drivability of the third NMOS N23 transistor may be greater than the drain-to-source current drivability of the of the second NMOS transistor N22.

If a voltage level of the output pad node detection signal PADO_det is lowered from a high level to a low level, the first PMOS transistor P21 may be turned on and a voltage of a node between the first and second PMOS transistors P21 and P22 may increase. A low level input voltage VIL may be defined as a maximum voltage of the output pad node detection signal PADO_det that is required to turn on the first and second PMOS transistors P21 and P22. If the second PMOS transistor P22 is turned on, a source voltage of the second PMOS transistor P22 may be lowered and the third PMOS transistor P23 may be turned off. In such a case, a high level signal may be outputted as the pull-up driver control signal Pdet through the output line 169 and the third NMOS transistor N23 may be turned on.

The automatic control logic circuit 160 may output a low level signal as the pull-up driver control signal Pdet at an initial state of the oscillation operation and may output a high level signal as the pull-up driver control signal Pdet at a steady state of the oscillation operation. If the pull-up driver control signal Pdet corresponding to a low level signal is outputted from the automatic control logic circuit 160, the current mirror inverting amplifier 140 may operate with the first gain as described with reference to FIG. 2 until an oscillation signal outputted from the current mirror inverting amplifier 140 is stabilized to have a steady state. If the pull-up driver control signal Pdet corresponding to a high level signal is outputted from the automatic control logic circuit 160, the current mirror inverting amplifier 140 may operate with the second gain which is lower than the first gain, after an oscillation signal outputted from the current mirror inverting amplifier 140 is stabilized to have a steady state. Accordingly, if the pull-up driver control signal Pdet corresponding to a high level signal is outputted from the automatic control logic circuit 160, the power consumption of the current mirror inverting amplifier 140 may be reduced.

From a time that the oscillation operation starts until a time that the oscillation operation reaches the steady state, an operation of the automatic control logic circuit 160 may depend on the fourth NMOS transistor N24. In one example, the fourth NMOS transistor N24 may have a drain-to-source current drivability which may be greater than a drain-to-source current drivability of the third NMOS transistor N23. Specifically, if the fourth NMOS transistor N24 is designed to have a high transconductance, the high level input voltage VIH may be lowered. During the initial state of the oscillation operation, a signal of the output pad node PADO may maintain a voltage level over a certain voltage (i.e., the high level input voltage VIH) and the output pad node detection signal PADO_det may also maintain a voltage level over a certain voltage (i.e., the high level input voltage VIH). In such a case, the automatic control logic circuit 160 realized using the Schmitt trigger circuit may recognize and receive the output pad node detection signal PADO_det as a high level signal. Thus, the automatic control logic circuit 160 may output a low level signal as the pull-up driver control signal Pdet.

If the oscillation operation reaches the steady state, the Schmitt trigger circuit may recognize and receive the output pad node detection signal PADO_det as a low level signal because a voltage level of the output pad node detection signal PADO_det is lower than the high level input voltage VIH of the Schmitt trigger circuit. Thus, the pull-up driver control signal Pdet outputted from the automatic control logic circuit 160 may change from a low level signal into a high level signal. In order to increase the high level input voltage VIH of the Schmitt trigger circuit, the third NMOS transistor N23 may be designed to have a relatively large drain current (Ids) and the second NMOS transistor N22 may be designed to have a relatively small drain current (Ids). That is, the high level input voltage VIH of the Schmitt trigger circuit may be varied by adjusting transconductances of the second and third NMOS transistors N22 and N23.

The sixth NMOS transistor N26 may suppress generation of a leakage current path in the automatic control logic circuit 160 while the enablement signal E0 is a low level signal so that the crystal oscillation circuit 100 operates in a disablement mode. If the enablement signal E0 is a low level signal, the output pad node PADO may maintain a high level signal and the detection logic circuit 150 may function as an open circuit to have a high impedance value. In such a case, the fifth NMOS transistor N25 may be turned off in response to the enablement signal E0 of a low level signal to suppress generation of a leakage current path in the Schmitt trigger circuit. Accordingly, the output line 169 may be electrically floated to cause a leakage current in the buffer 161. However, according to the present embodiment, the sixth NMOS transistor N26 may be turned on in response to the inverted signal E0B of the enablement signal E0 to connect the output line 169 to the ground terminal. As a result, generation of a leakage current path in the buffer 161 may be prevented.

Even at a time that the enablement signal E0 changes from a low level signal into a high level signal to commence an operation of the crystal oscillation circuit 100, the pull-up driver control signal Pdet may still be a low level signal. However, until a certain delay time elapses from the time that an operation of the crystal oscillation circuit 100 starts, the detection logic circuit 150 temporarily maintains a high impedance state due to an open circuit of the capacitor 152. Thus, a normal signal of the output pad node detection signal PADO_det may not be inputted to the automatic control logic circuit 160. In such a case, the fourth PMOS transistor P24 coupled between the power supply voltage VDD terminal and the input line 168 may be turned off, and the capacitor 162 coupled between the power supply voltage VDD terminal and the input line 168 may be discharged. Accordingly, the input line 168 may maintain a high level state, and the pull-up driver control signal Pdet may become a low level signal.

Figure 5:
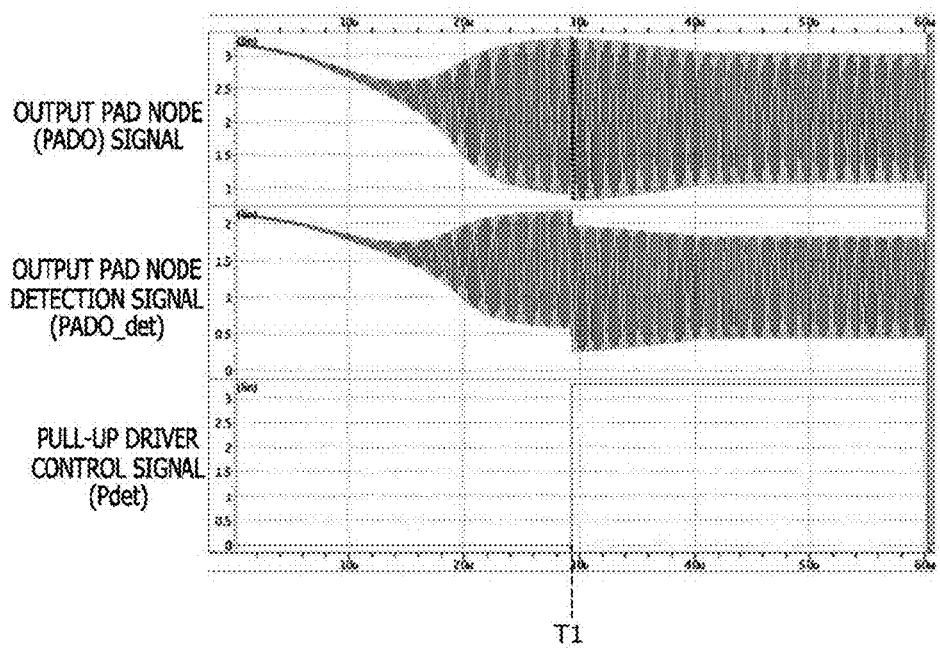
FIG. 5 illustrates waveforms of an output pad node signal, an output pad node detection signal, and a pull-up driver control signal of a crystal oscillation circuit according to an embodiment of the present disclosure.

FIG. 5 illustrates waveforms of a signal of the output pad node PADO, the output pad node detection signal PADO_det and the pull-up driver control signal Pdet of the crystal oscillation circuit 100 according to an embodiment of the present disclosure. In FIG. 5, the abscissa denotes a time and the ordinate denotes an amplitude or a voltage level of signals. Referring to FIG. 5, the signal of the output pad node PADO may start to oscillate with a relatively small amplitude at a high voltage level and may oscillate with a relatively large amplitude of about 0.8 volts to about 3.3 volts before a first time "T1" that the oscillation signal is stabilized to have a steady state. The output pad node detection signal PADO_det may have an amplitude which is less than an amplitude of the signal of the output pad node PADO. At this state, the pull-up driver control signal Pdet may maintain a low level signal, and the current mirror inverting amplifier 140 may operate with the first gain which is relatively high. After the first time "T1", the signal of the output pad node PADO and the output pad node detection signal PADO_det may oscillate to have a certain amplitude and the pull-up driver control signal Pdet may change from a low level signal into a high level signal. Thus, the current mirror inverting amplifier 140 may operate with the second gain, which is lower than the first gain, to reduce the power consumption of the crystal oscillation circuit 100.

The embodiments of the present disclosure have been disclosed above for illustrative purposes. Those of ordinary skill in the art will appreciate that various modifications, additions, and substitutions are possible, without departing from the scope and spirit of the present disclosure as disclosed in the accompanying claims.

What is claimed is:

1. A crystal oscillation circuit comprising:
   a crystal oscillator coupled between an input pad node and an output pad node;
   a current mirror inverting amplifier configured to have a first input terminal coupled to the input pad node and an output terminal coupled to the output pad node, wherein the current mirror inverting amplifier has a first gain or a second gain lower than the first gain according to an operation state;
   a detection logic circuit configured to detect a signal of the output pad node to generate an output pad node detection signal; and
   an automatic control logic circuit configured to apply a pull-up driver control signal to a second input terminal of the current mirror inverting amplifier in response to the output pad node detection signal,
   wherein the current mirror inverting amplifier operates with the first gain or the second gain according to the pull-up driver control signal, and
   wherein the current mirror inverting amplifier includes:
      a current source generating a current;
      a first pull-up driver coupled between a power supply voltage terminal and an output line;
      a pull-down driver coupled between the output line and a ground terminal; and
      a second pull-up driver coupled between the power supply voltage terminal and the output line.

2. The crystal oscillation circuit of claim 1, wherein the output pad node detection signal has an amplitude which is smaller than an amplitude of a signal of the output pad node.

3. The crystal oscillation circuit of claim 2, wherein the detection logic circuit functions as an open circuit if a signal of the output pad node is a direct current (DC) signal.

4. The crystal oscillation circuit of claim 1,
   wherein the automatic control logic circuit generates a first pull-up driver control signal so that the current mirror inverting amplifier operates with the first gain, until an oscillation signal outputted from the current mirror inverting amplifier is stabilized to have a steady state; and
   wherein the automatic control logic circuit generates a second pull-up driver control signal so that the current mirror inverting amplifier operates with the second gain, after an oscillation signal outputted from the current mirror inverting amplifier is stabilized to have a steady state.

5. The crystal oscillation circuit of claim 4,
   wherein the first pull-up driver control signal is a low level signal; and
   wherein the second pull-up driver control signal is a high level signal.

6. The crystal oscillation circuit of claim 1,
   wherein the current source is configured to include a first PMOS transistor and a resistor which are coupled in series between the power supply voltage terminal and the ground terminal; and
   wherein a drain and a gate of the first PMOS transistor are coupled to each other so that the first PMOS transistor has a diode-connected structure.

7. The crystal oscillation circuit of claim 6,
   wherein the first pull-up driver is realized using a second PMOS transistor coupled between the power supply voltage terminal and the output line; and
   wherein gates of the first and second PMOS transistors are coupled to each other so that the first and second PMOS transistors constitute a first current mirror circuit.

8. The crystal oscillation circuit of claim 7,
   wherein the pull-down driver is configured to include a first NMOS transistor and a second NMOS transistor which are coupled in series between the output line and the ground terminal;
   wherein a signal of the input pad node is applied to a gate of the first NMOS transistor; and
   wherein an enablement signal is applied to a gate of the second NMOS transistor.

9. The crystal oscillation circuit of claim 8, wherein transconductance values of the first NMOS transistor and the second NMOS transistor are greater than a transconductance value of the second PMOS transistor.

10. The crystal oscillation circuit of claim 8,
    wherein the second pull-up driver is configured to include a third PMOS transistor and a fourth PMOS transistor which are coupled in series between the power supply voltage terminal and the output line;
    wherein the pull-up driver control signal is applied to a gate of the third PMOS transistor; and
    wherein gates of the first and fourth PMOS transistors are coupled to each other so that the first and fourth PMOS transistors constitute a second current mirror circuit.

11. The crystal oscillation circuit of claim 1, wherein the detection logic circuit is configured to include a PN diode and a capacitor which are coupled in series between the output pad node and an output line of the detection logic circuit.

12. The crystal oscillation circuit of claim 1, wherein the automatic control logic circuit is configured to include a Schmitt trigger circuit coupled between an input line through which the output pad node detection signal is inputted and an output line through which the pull-up driver control signal is outputted.

13. The crystal oscillation circuit of claim 12, wherein the Schmitt trigger circuit includes:
- a fifth PMOS transistor and a sixth PMOS transistor coupled in series between a power supply voltage terminal and the output line;
- a third NMOS transistor and a fourth NMOS transistor coupled in series between the output line and a ground terminal;
- a seventh PMOS transistor having a gate coupled to the output line, a drain coupled to the ground terminal, and a source coupled to a node between the fifth and sixth PMOS transistors; and
- a fifth NMOS transistor having a gate coupled to the output line, a drain coupled to the power supply voltage terminal, and a source coupled to a node between the third and fourth NMOS transistors.

14. The crystal oscillation circuit of claim 13, wherein the fifth NMOS transistor has a drain-to-source current drivability which is greater than a drain-to-source current drivability of the fourth NMOS transistor.

15. The crystal oscillation circuit of claim 13,
wherein the automatic control logic circuit further includes a sixth NMOS transistor and a seventh NMOS transistor which are coupled in series between the fourth NMOS transistor and the ground terminal;
wherein a gate of the sixth NMOS transistor is coupled to the output pad node; and
wherein an enablement signal is applied to a gate of the seventh NMOS transistor.

16. The crystal oscillation circuit of claim 15, wherein the sixth NMOS transistor has a drain-to-source current drivability which is greater than a drain-to-source current drivability of the fifth NMOS transistor.

17. The crystal oscillation circuit of claim 16,
wherein the automatic control logic circuit further includes an eighth PMOS transistor and a capacitor which are coupled in parallel between the power supply voltage terminal and the input line; and
wherein the enablement signal is applied to a gate of the eighth PMOS transistor.

18. The crystal oscillation circuit of claim 17, wherein the automatic control logic circuit further includes a buffer disposed in the output line.

19. The crystal oscillation circuit of claim 18,
wherein the automatic control logic circuit further includes an eighth NMOS transistor which is coupled between the output line and the ground terminal; and
wherein an inverted signal of the enablement signal is applied to a gate of the eighth NMOS transistor.

* * * * *